(12) United States Patent
Rogers

(10) Patent No.: US 11,387,799 B2
(45) Date of Patent: Jul. 12, 2022

(54) REDUCING DYNAMIC ERROR VECTOR MAGNITUDE IN CASCODE AMPLIFIERS

(71) Applicant: SKYWORKS SOLUTIONS, INC., Irvine, CA (US)

(72) Inventor: John William Mitchell Rogers, Nepean (CA)

(73) Assignee: SKYWORKS SOLUTIONS, INC., Irvine, CA (US)

(*) Notice: Subject to any disclaimer, the term of this patent is extended or adjusted under 35 U.S.C. 154(b) by 62 days.

(21) Appl. No.: 17/078,165

(22) Filed: Oct. 23, 2020

(65) Prior Publication Data
US 2021/0126598 A1 Apr. 29, 2021

Related U.S. Application Data

(60) Provisional application No. 62/927,380, filed on Oct. 29, 2019.

(51) Int. Cl.
H03F 1/22 (2006.01)
H03F 3/24 (2006.01)
H03F 1/30 (2006.01)
H03F 3/195 (2006.01)
H03F 1/02 (2006.01)
H03F 1/56 (2006.01)

(52) U.S. Cl.
CPC .......... H03F 3/245 (2013.01); H03F 1/0233 (2013.01); H03F 1/22 (2013.01); H03F 1/302 (2013.01); H03F 1/565 (2013.01); H03F 3/195 (2013.01); H03F 2200/318 (2013.01); H03F 2200/451 (2013.01)

(58) Field of Classification Search
CPC .................................... H03F 1/22; H03F 1/30
USPC ........................................ 330/311, 289, 296
See application file for complete search history.

(56) References Cited

U.S. PATENT DOCUMENTS

| | | | | |
|---|---|---|---|---|
| 9,985,588 | B2 * | 5/2018 | Rogers | H03F 1/22 |
| 10,320,336 | B2 * | 6/2019 | Rogers | H03F 1/3241 |
| 2009/0179706 | A1 * | 7/2009 | Wong | H03F 1/0205 330/311 |
| 2013/0127544 | A1 * | 5/2013 | Murakami | H03F 1/523 330/296 |

* cited by examiner

Primary Examiner — Henry Choe
(74) Attorney, Agent, or Firm — Lando & Anastasi, LLP

(57) ABSTRACT

A power amplifier including a cascode output stage, a bias circuit, and a temperature compensation and bias boost circuit. The cascode output stage has an input and an output and includes first and second transistors connected in series. A base of the first transistor is coupled to the input, an emitter of the first transistor is coupled to a reference potential, a collector of the first transistor is coupled to an emitter of the second transistor, and a collector of the second transistor is coupled to a supply voltage and the output. The bias circuit is coupled to the base of the second transistor. The bias boost circuit is coupled to the base of the first transistor, compensates for changes in temperature of the cascode output stage, and increases a bias current provided to the first transistor responsive to an increase in the temperature of the cascode output stage.

19 Claims, 11 Drawing Sheets

REDUCING DYNAMIC ERROR VECTOR MAGNITUDE IN CASCODE AMPLIFIERS

CROSS-REFERENCE TO RELATED APPLICATIONS

This application claims priority under 35 U.S.C. § 119(e) to U.S. Provisional Patent Application No. 62/927,380, titled REDUCING DYNAMIC ERROR VECTOR MAGNITUDE IN CASCODE AMPLIFIERS, filed Oct. 29, 2019, the content of which is incorporated herein in its entirety for all purposes.

BACKGROUND

Field of Invention

The present invention relates generally to amplifier circuits, and more particularly to circuits and techniques for reducing the Dynamic Error Vector Magnitude in a cascode power amplifier circuit.

Discussion of Related Art

The Error Vector Magnitude (EVM) performance of a power amplifier (PA) is an important parameter if the power amplifier is intended for a linear mode of operation in applications such as WiFi. In order to achieve good EVM, constellation points in a modulated waveform must be amplified as accurately as possible by the power amplifier so that there is no amplitude or phase distortion in the waveform at the output of the amplifier. Since the amplitude of a signal in a complex modulation scheme varies greatly with time, the phase shift and the gain of the amplifier must be very stable over a wide range of power levels to keep the EVM as low as possible.

There are two ways to measure the EVM of an amplifier. The first is called static EVM. In this case the amplifier is turned on before the measurement is performed and therefore the amplifier has time to find a stable operating point. The second type of measurement is called Dynamic EVM (DEVM). In this case the amplifier is enabled or switched on just as the measurement is about to commence. In this case, even if the amplifier had a completely linear phase and amplitude characteristic versus power level, the amplifier can still experience a change in amplitude and phase during the measurement due to a shift in its operating point. This is usually due to the amplifier heating up from room temperature to a new thermal equilibrium point due to its own power dissipation. Thus, DEVM is generally worse than static EVM in most amplifiers.

In modern RF devices, changes in the operating point of a power amplifier occur frequently. For example, many electronic RF devices, such as smart phones and tablets are powered by a battery. Because the transmit power of a power amplifier consumes a significant portion of the total system DC power, a number of techniques are employed to reduce power amplifier power usage. For example, many power amplifiers offer an adjustable DC supply voltage to optimize the maximum RF output power level versus its DC power consumption. Further, most power amplifiers can be powered-down or disabled when not in use to conserve power, such as while receiving or between packets during transmission, and then powered back on or re-enabled as needed. Still other power amplifiers may use envelope tracking, where the power supplied to the power amplifier tracks the envelope of the output signal. As a result, changes in the operating point of a power amplifier occur frequently during normal operation, and accordingly the DEVM performance of a power amplifier is a very important parameter for many applications.

There are existing solutions for improving the DEVM of a power amplifier. Most of these typically involve controlling the current through the amplifier with the use of off-chip filters and biasing ICs which control the current through the amplifier. In such solutions, just as the amplifier turns on and is relatively cool and has relatively high gain, the amplifier is supplied with less current, but as the amplifier heats up more current is supplied in an effort to keep the gain constant. However, such existing solutions typically involve complex off-chip circuitry to fix this problem.

SUMMARY OF INVENTION

Aspects and embodiments of the present disclosure are directed to circuits and techniques for reducing the DEVM in a cascode power amplifier circuit.

In accordance with an aspect of the present disclosure, a power amplifier is provided comprising a cascode output stage, a bias circuit, and a temperature compensation and bias boost circuit. The cascode output stage has an input to receive a radio frequency input signal and an output to provide an amplified radio frequency output signal. The cascode output stage includes a first transistor and a second transistor connected in series between a first supply voltage and a reference potential, the first and second transistors each having a base, a collector, and an emitter, the base of the first transistor being coupled to the input to receive the radio frequency input signal, the emitter of the first transistor being coupled to the reference potential, the collector of the first transistor being coupled to the emitter of the second transistor, and the collector of the second transistor being coupled to the first supply voltage and the output to provide the amplified radio frequency output signal. The bias circuit is coupled to the base of the second transistor to bias the second transistor, and the temperature compensation and bias boost circuit is coupled to the base of the first transistor. The temperature compensation and bias boost circuit is configured to compensate for changes in temperature of the cascode output stage and to increase a bias current provided to the first transistor in response to an increase in the temperature of the cascode output stage.

In accordance with an aspect of the present disclosure, the temperature compensation and bias boost circuit includes a third transistor, first and second resistors, a first capacitor, and first, second, and third diodes. The third transistor has a base, a collector, and an emitter, the collector being coupled to a second supply voltage different than the first supply voltage, the emitter being coupled to the base of the first transistor through the first resistor, and the base being coupled to the reference potential through the first capacitor. The second resistor is coupled in series with the first diode between the second supply voltage and the base of the third transistor, and the second and third diodes are coupled in series between the base of the third transistor and the reference potential.

In accordance with an aspect of the present disclosure, changes with temperature of a voltage dropped across the second and third diodes substantially matches changes with temperature of a base to emitter voltage dropped across the first and third transistors.

In accordance with an embodiment, the cascode output stage and the temperature compensation and bias boost circuit are integrated on a GaAs semiconductor die, and the first, second, and third diodes are physically disposed on the GaAs semiconductor die adjacent the first transistor to be closely thermally coupled thereto. In accordance with a further aspect of this embodiment, the second transistor is physically spaced apart on the GaAs semiconductor die from the first transistor to be thermally isolated from the first transistor.

In accordance with an aspect of the present disclosure, the bias circuit includes third and fourth resistors coupled in series between the first supply voltage and the reference potential, and a fourth transistor having a base, a collector, and an emitter, the base being connected a node connecting the third and fourth resistors, the collector being coupled to the supply voltage, and the emitter being coupled to a second capacitor that is coupled to the reference potential and the base of the second transistor.

In accordance with a further aspect of the present disclosure, the power amplifier further comprises an enable circuit coupled to the temperature compensation and bias boost circuit to receive an enable signal and enable the temperature compensation and bias boost circuit and the cascode output stage responsive to the enable signal.

In accordance with various embodiments, the power amplifier may further comprise an input impedance matching circuit coupled between the input and the base of the first transistor, the input impedance matching circuit including an inductor coupled between the input and the reference potential and a third capacitor coupled between the input and the base of the first transistor.

In accordance with various embodiments, the enable circuit includes fifth and sixth transistors and fifth and sixth resistors. The fifth transistor and the sixth transistor each have a base, a collector, and an emitter, the base of the fifth transistor being coupled to the collector of the sixth transistor, the emitter of the fifth transistor and the emitter of the sixth transistor being coupled together and to the reference potential, and the collector of the fifth transistor being coupled to a cathode of the first diode, an anode of the second diode, and the base of the third transistor. The fifth resistor is coupled between the second supply voltage and the collector of the sixth transistor, and the sixth resistor is coupled between the base of the sixth transistor and an enable contact to receive the enable signal.

In accordance with various embodiments, the power amplifier can further comprise at least one additional gain stage coupled to the input of the cascode output stage.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF DRAWINGS

Various aspects of at least one embodiment are discussed below with reference to the accompanying drawings. In the drawings, which are not intended to be drawn to scale, each identical or nearly identical component that is illustrated in various drawings is represented by a like numeral. For purposes of clarity, not every component may be labeled in every drawing. The drawings are provided for the purposes of illustration and explanation, and are not intended as a definition of the limits of the invention. In the drawings.

DETAILED DESCRIPTION

Various aspects and embodiments disclosed herein relate to power amplifiers, and to improvements in the DEVM performance of same. Many power amplifiers include a cascode amplifier, either alone or as a final output gain stage of a multi-stage power amplifier.

A cascode amplifier is a two-stage amplifier including a common emitter stage feeding into a common base stage for bipolar technologies, or a common source stage feeding into a common gate stage for field effect transistor (FET) technologies. Compared to a single stage amplifier, a cascode amplifier may exhibit higher input-output isolation, higher input impedance, high output impedance, higher gain, and higher bandwidth. The cascode amplifier is typically constructed from two transistors with one operating as common emitter or common source and the other as a common base or common gate. The cascode amplifier improves input-output isolation and bandwidth as there is no direct coupling from the output to input.

Figure 1A:
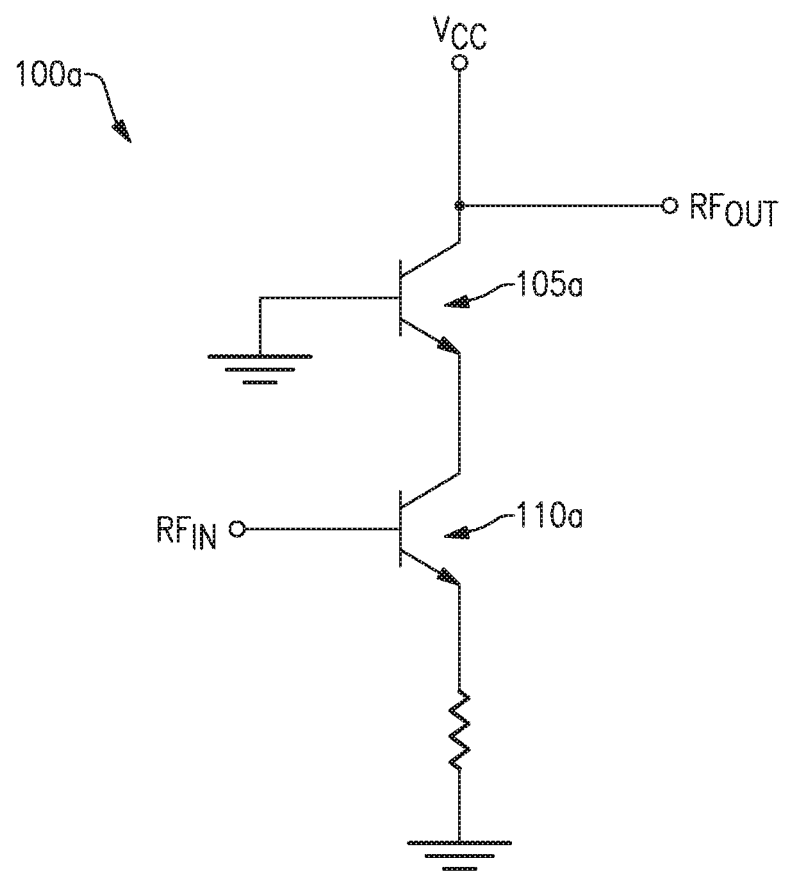
FIG. 1A illustrates an example of a cascode amplifier circuit using bipolar transistors.

An example of a cascode amplifier circuit that is implemented using bipolar technology is illustrated in FIG. 1A, generally at 100a, where the common base transistor is indicated at 105a and the common emitter transistor is indicated at 110a. As shown in FIG. 1A, the RF input signal RFin is received on a base of the common emitter transistor 110a, the RF output signal RFout is provided at the collector of the common base transistor 105a, and the collector of the common emitter transistor is coupled to the emitter of the common base transistor 105a.

Figure 1B:
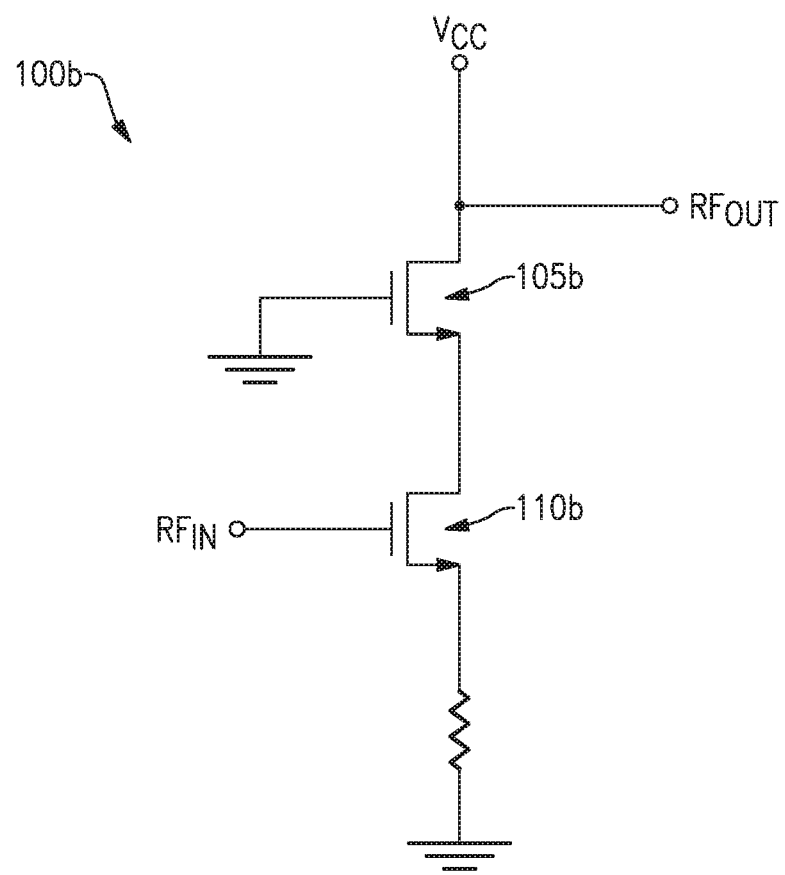
FIG. 1B illustrates an example of a cascode amplifier circuit using CMOS transistors.

An example of a cascode amplifier circuit that is implemented using CMOS technology is illustrated in FIG. 1B, generally at 100b, where the common gate transistor is indicated at 105b and the common source transistor is indicated at 110a. As shown in FIG. 1A, the RF input signal RFin is received on a gate of the common source transistor 110b, the RF output signal RFout is provided at the drain of the common gate transistor 105b, and the drain of the common source transistor is coupled to the source of the common gate transistor 105b. The cascode amplifier circuits of FIGS. 1A and 1B may be used as an output stage of a multi-stage power amplifier as illustrated in FIG. 2.

Figure 2:
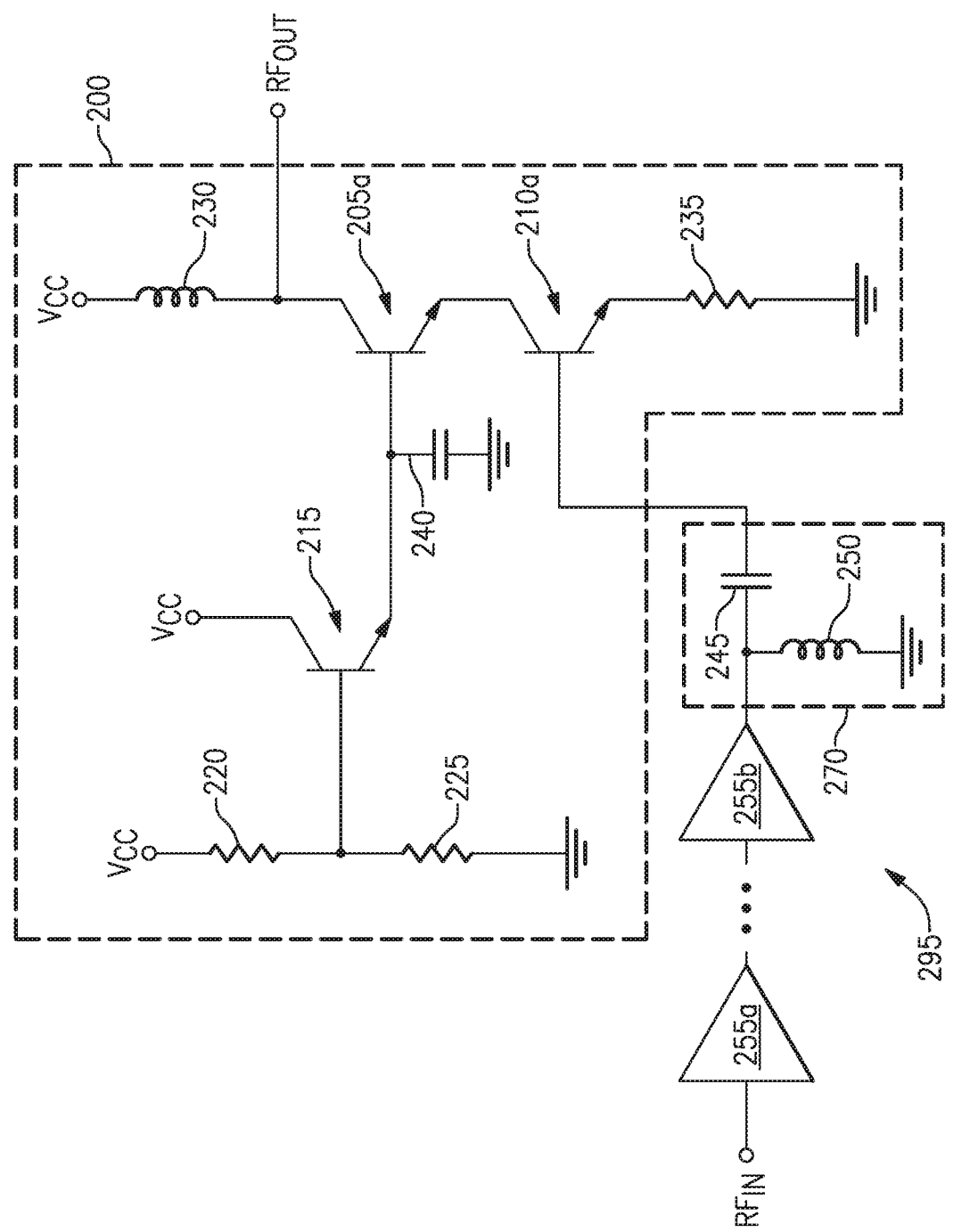
FIG. 2 illustrates a power amplifier including one or more gain stages and a cascode amplifier circuit output stage.

FIG. 2 illustrates a multi-stage power amplifier that includes a cascode output stage. Although the multi-stage power amplifier of FIG. 2 includes a cascode output stage implemented with bipolar transistors in accordance with FIG. 1A, it should be appreciated that CMOS technology may instead be used. The multi-stage power amplifier 295 includes one or more gain stages 255a and 255b, which may be either fixed gain stages or variable gain stages and may be implemented in either CMOS or bipolar technology, and a cascode output stage 200. As shown, the multi-stage power amplifier 295 includes an input impedance matching circuit 270 formed of a capacitor 245 and an inductor 250 that is used to match the input impedance of the cascode output stage 200 to the output impedance of the prior gain stage 255b, e.g., 50 Ohms. Although not shown, impedance matching circuits may also be provided at the input of each of the gain stages 255a and 255b if needed.

The cascode output stage 200 includes two transistors coupled together in series between a supply voltage $V_{CC}$ and a reference potential, such as ground. The supply voltage may have a voltage between about 10 to 12 volts. As shown, the common gate stage includes transistor 205a and is coupled to the supply voltage $V_{CC}$ through an inductor 230 representing the inductance of the bond pad and associated wiring connecting the collector of the common gate transistor to the supply voltage $V_{CC}$. The emitter of the common base stage transistor 205a is coupled to the collector of transistor 210a of the common emitter stage, and the emitter of the transistor 210a is coupled to ground through a resistor 235. The base of the transistor 205a is connected to a bias circuit formed of a transistor 215, a pair of resistors 220 and 225 that act as a voltage divider, and a capacitor 240. As shown, the resistors 220 and 225 are coupled in series between the supply voltage $V_{CC}$ and ground, with the base of the transistor 215 being connected to the node connecting the resistors 220 and 225 in series. The collector of the transistor 215 is coupled to the supply voltage, either directly or through a resistor (not shown), and the emitter of the transistor 215 is connected to the base of transistor 205a and the capacitor 240.

In use, an RF signal received at the input of gain stage 255a is amplified, the amplified signal is provided to subsequent gain stage(s) 255b, and then to the cascode output stage 200 where it is amplified and the amplified RF output signal RFout is provided at the collector of the transistor 205a.

Figure 3:
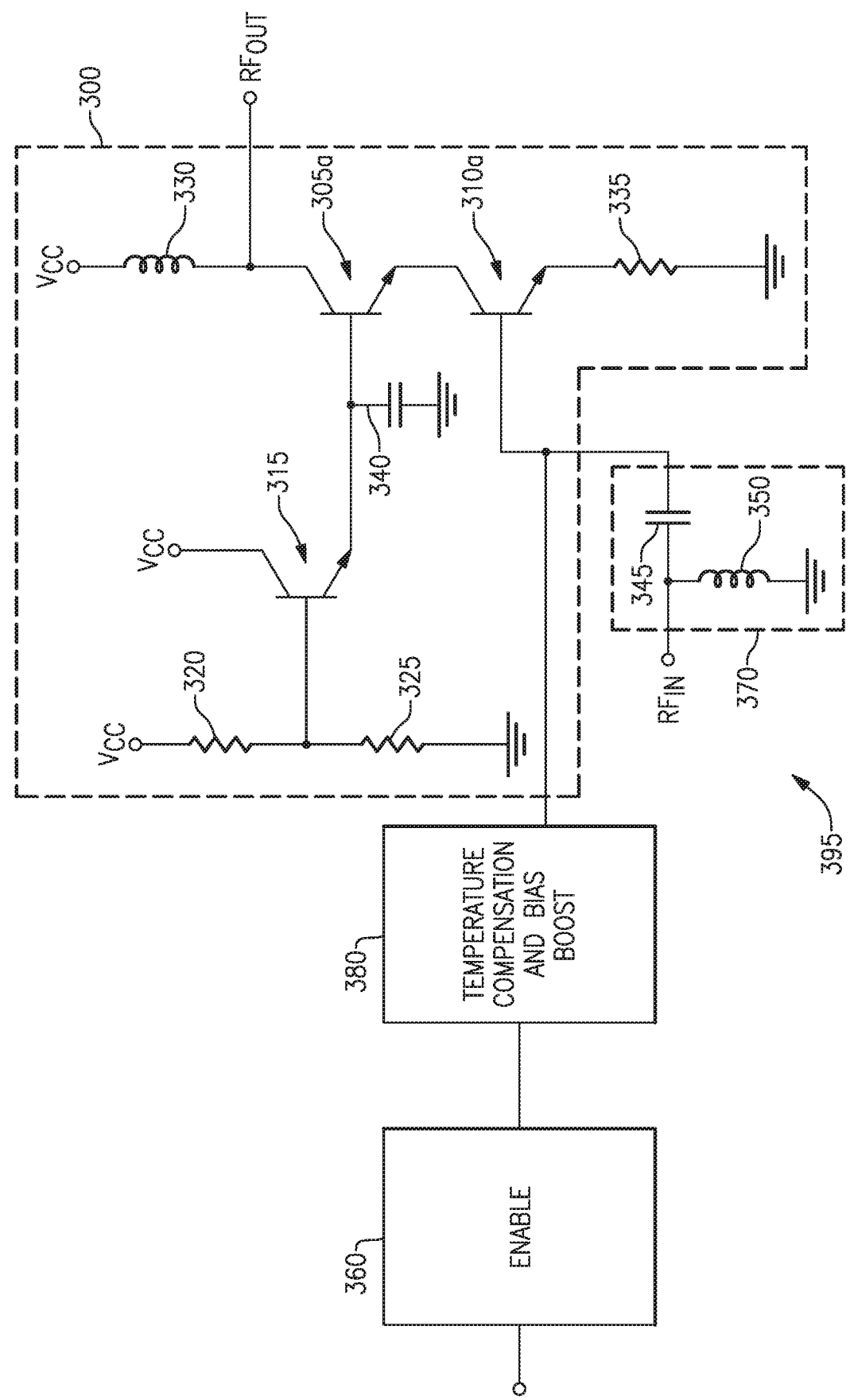
FIG. 3 is a power amplifier in accordance with aspects of the present disclosure having a cascode output stage and improved DEVM performance.

FIG. 3 is a power amplifier in accordance with aspects of the present disclosure having a cascode output stage and improved DEVM performance. The power amplifier 395 includes a cascode output stage 300 and an input impedance matching circuit 370. The power amplifier 395 further includes an enable circuit 360 configured to enable and disable the cascode output stage 300, and a temperature compensation and bias boost circuit 380. In FIG. 3, the cascode output stage and the input impedance matching circuit 370 include the same components described previously with respect to FIG. 2, and are denoted by similar reference numbers differing only by the first digit. The power amplifier 395 of FIG. 3 may include one or more additional gain stages prior to the input (RFin) of the input impedance matching network 370 (e.g., similar to gain stages 255a and 255b of FIG. 2), but are not shown. As with the power amplifier of FIG. 2, such additional gain stages may be implemented in CMOS technology or bipolar technology, or a combination of both. As with the power amplifier of FIG. 2, the cascode output stage 300 is shown as being implemented in bipolar technology, although the present invention is not so limited as the cascode output stage could alternatively be implemented in CMOS technology.

The input impedance matching circuit 370 is again formed of a capacitor 345 and an inductor 350 and is used to match the input impedance of the cascode output stage 300 to the output impedance of prior circuitry, e.g., 50 Ohms. The cascode output stage 300 again includes two transistors coupled together in series between a supply voltage $V_{CC}$, and a reference potential, such as ground. The supply voltage $V_{CC}$ may have a voltage between about 10 to 12 volts. As shown, the common gate stage includes transistor 305a and is coupled to the supply voltage $V_{CC}$ through an inductor 330 representing the inductance of the bond pad and associated wiring connecting the collector of the common gate transistor to the supply voltage $V_{CC}$. The emitter of the common base stage transistor 305a is coupled to the collector of transistor 310a of the common emitter stage, and the emitter of the transistor 310a is coupled to ground through a resistor 335. The base of the transistor 305a is connected to a bias circuit formed of a transistor 315, a pair of resistors 320 and 325 acting as a voltage divider, and a capacitor 340. The resistors 320 and 325 are coupled in series between the supply voltage $V_{CC}$ and ground, the base of the transistor 315 is connected to the node connecting the resistors 320 and 325 in series, the collector of the transistor 315 is coupled to the supply voltage, either directly or through a resistor (not shown), and the emitter of the transistor 315 is connected to the base of transistor 305a and the capacitor 340.

As noted above, the enable circuit 360 is configured to enable and disable the cascode output stage 300 responsive to an enable signal received from a controller (not shown, but described below with respect to power management system 1010 of FIG. 11). It is also used enable and disable the temperature compensation and bias boost circuit 380, such that both are enabled or disabled together. The temperature compensation and bias boost circuit 380 performs two different functions; first it provides temperature compensation for the cascode output stage to compensate for changes (increases) in temperature as the power amplifier heats up from a disabled state to an enabled and transmitting state, and second it provide a boost of bias current to increase the current flow through the common base transistor 310a as the temperature of the power amplifier and the cascode output stage rises.

Figure 4:
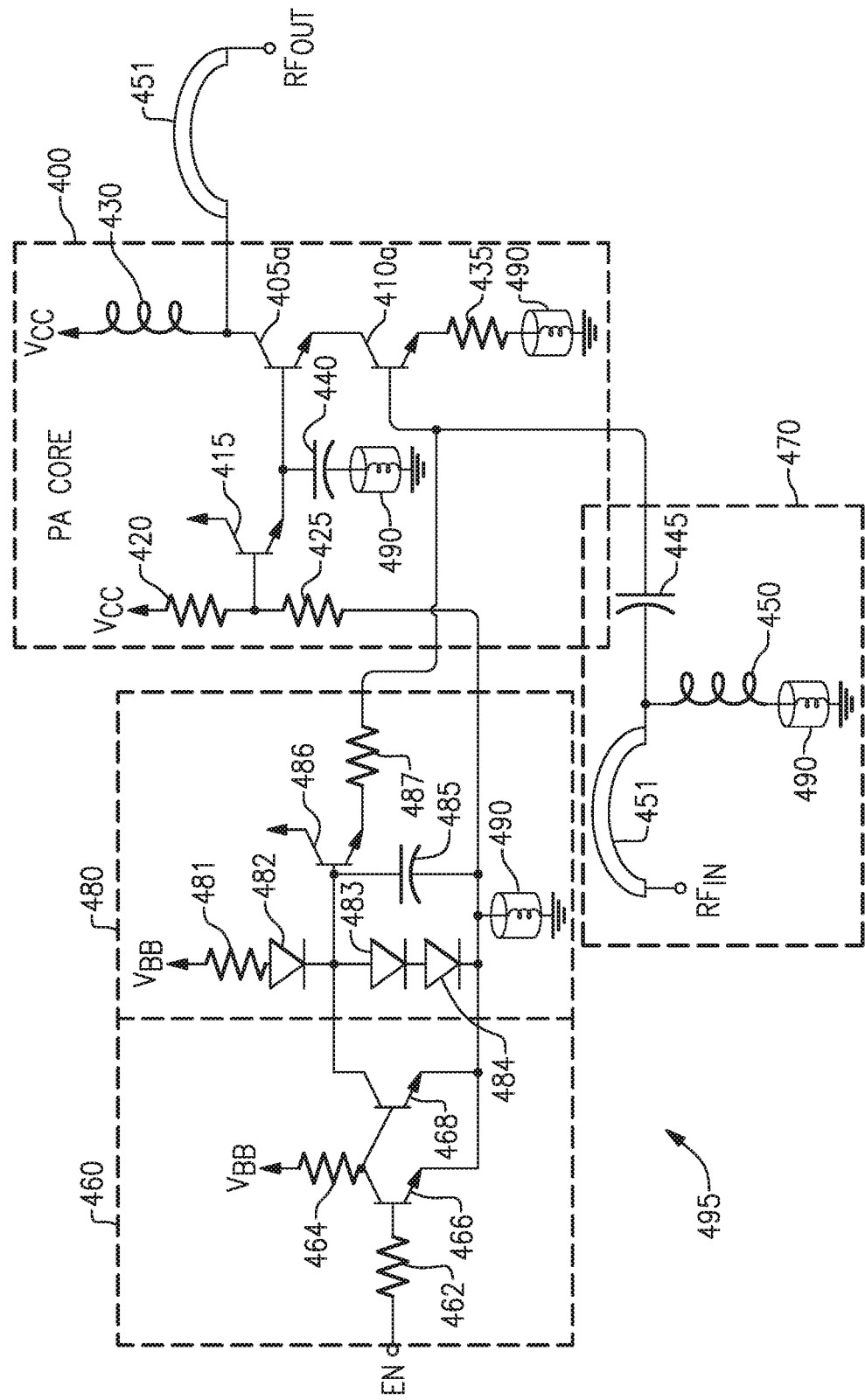
FIG. 4 is a more detailed view of the power amplifier of FIG. 3 in accordance with aspects of the present disclosure.

FIG. 4 is a more detailed view of the power amplifier of FIG. 3 in accordance with aspects of the present disclosure having improved DEVM performance. The power amplifier 495 includes a cascode output stage 400, an input impedance matching circuit 470, an enable circuit 460, and a temperature compensation and bias boost circuit 480. In FIG. 4, the cascode output stage 400 and the input impedance matching circuit 470 include similar components as described previously with respect to FIGS. 2 and 3, and are denoted by similar reference numbers differing only by the first digit. The power amplifier 495 of FIG. 4 may include one or more additional gain stages prior to the input (RFin) of the input impedance matching network 470 (e.g., similar to gain stages 255a and 255b of FIG. 2), but are not shown. As with the power amplifiers of FIGS. 2 and 3, such additional gain stages may be implements in CMOS technology or bipolar technology, or a combination of both. As with the power amplifier of FIGS. 2 and 3, the cascode output stage 400 is shown as being implemented in bipolar technology, although the present invention is not so limited.

The input impedance matching circuit 470 is formed of a capacitor 445 and an inductor 450 and is used to match the input impedance of the cascode output stage 400 to the output impedance of prior circuitry, e.g., 50 Ohms. The inductor 450 is coupled to a ground pad 490 that is a common ground for each of the cascode output stage 400, the input impedance matching network 470, the enable circuit 460 and the temperature compensation and bias boost circuit 480. As shown in FIG. 4, the inductance of the bondwire connected to the contact receiving the RF input signal RFin is represented by an inductor 451.

The cascode output stage 400 again includes two transistors coupled together in series between a supply voltage $V_{CC}$, and the common ground. The supply voltage $V_{CC}$ may have a voltage between about 10 to 12 volts. As shown, the common gate stage includes transistor 405a and is coupled to the supply voltage $V_{CC}$ through an inductor 430 representing the inductance of the bond pad and associated wiring connecting the collector of the common gate transistor to the supply voltage $V_{CC}$. The emitter of the common base stage transistor 405a is coupled to the collector of transistor 410a of the common emitter stage, and the emitter of the transistor 410a is coupled to the common ground through a resistor 435. The base of the transistor 405a is connected to a bias circuit formed of a transistor 415, a pair of resistors 420 and 425 acting as a voltage divider, and a capacitor 440. The resistors 420 and 425 are coupled in series between the supply voltage $V_{CC}$ and ground, the base of the transistor 415 is connected to the node connecting the resistors 420 and 425 in series, the collector of the transistor 415 is coupled to the supply voltage $V_{CC}$, either directly or through a resistor (not shown), and the emitter of the transistor 415 is connected to the base of transistor 405a and the capacitor 440. The capacitor 440 is coupled to the common ground.

The enable circuit 460 includes a pair of resistors 462 and 464 and a pair of transistors 466 and 468. Resistor 462 is coupled between an enable contact or terminal that receives the enable signal (EN) and a base of the transistor 466. The emitters of transistors 466 and 468 are coupled to the common ground, the collector of transistor 466 is coupled to a bias boost voltage supply $V_{BB}$ through the resistor 464 and coupled to the base of transistor 468. The bias boost voltage supply $V_{BB}$ may be a lesser voltage than the supply voltage $V_{CC}$, and typically has a value between about 3-5 volts.

The temperature compensation and bias boost circuit 480 includes a plurality of diodes 482, 483, 484 coupled in series with a resistor 481 between the bias boost voltage supply $V_{BB}$ and the common ground. The combination of resistor 481 and diodes 482, 483, and 484 acts as a temperature sensitive voltage divider, the output voltage of which varies with the temperature of transistor 410a. In order to reduce gain variations with temperature, diodes 482, 483, and 484 are thermally coupled to transistor 410a (the gain controlling device in the cascode output stage 400), such as by being fabricated in close physical proximity to transistor 410a.

As shown, the anode of diode 482 is coupled to the bias boost voltage supply $V_{BB}$ through the resistor 481, the cathode of diode 482 is coupled to the anode of diode 483, the cathode of diode 483 is coupled to the anode of diode 484, and the cathode of diode 484 is coupled to the common ground. The node connecting diodes 482 and 483 is coupled to the collector of transistor 468 of the enable circuit, to the base of a transistor 486, and to a capacitor 485 that is coupled to the common ground. The collector of the transistor 486 is coupled to the bias boost supply voltage $V_{BB}$ either directly or through a resistor (not shown), and the emitter of the transistor 486 is coupled to the base of the transistor 410a of the cascode output stage 400 through a resistor 487.

As noted above, the enable circuit 460 is configured to enable and disable the cascode output stage 400 and the temperature compensation and bias boost circuit 480 responsive to an enable signal (EN) received from a controller (not shown).

In response to the enable signal (a logic HIGH), the temperature compensation and bias boost circuit 480 and the cascode output stage are enabled and the power amplifier 495 heats up. As the power amplifier 495 heats up, diodes 483 and 484, which are biased at a relatively constant current via diode 482 and resistor 481 heat up and see their voltage drop (the voltage drop across a diode varies with temperature, and become less (e.g., by about 2 mV/° C.) with increasing temperature). The voltage drop across diodes 483 and 484 matches the base to emitter voltage drop experienced by transistors 486 and 410a as these transistors heat up, and acts to keep the current provided to transistor 410a from dropping as the temperature rises. Additionally, as the temperature rises, the voltage drop across diode 482 also drops, acting to increase the voltage applied to the base of transistor 486 and increase the current flow through the transistor 410a. These two effects work together to help provide a very low gain versus temperature dependence in the power amplifier, leading to better DEVM performance.

Another technique that can be implemented to reduce the DEVM performance of the power amplifier is to thermally isolate transistor 405a from transistor 410a, such as by locating transistor 405a so that it is physically spaced apart on the die from transistor 410a (and diodes 482-484). While transistor 410a (the common emitter stage) controls the gain of the cascode output stage 400, it is biased with a relatively low collector to emitter voltage from transistor 486, and therefore most of the power and thus, most of the heat is generated in transistor 405a. Accordingly, where transistors 405a and 410a are physically separated on the die, then transistor 410a can remain relatively cool compared to transistor 405a and therefore have a relatively flat gain during the startup transient of the power amplifier.

Figure 5:
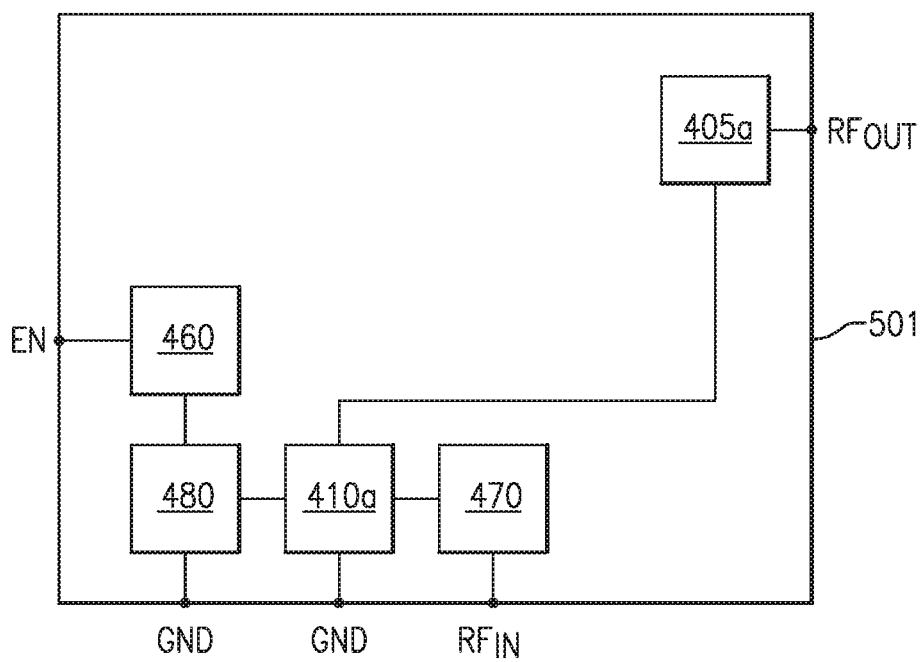
FIG. 5 is a representation of a semiconductor die illustrating the manner in which various components of the power amplifier may be laid out on the die to optimize DEVM performance in accordance with aspects of the present disclosure.

FIG. 5 is a representation of a semiconductor die illustrating the manner in which various components of the power amplifier may be laid out so that diodes 482, 483, and 484 are thermally coupled with transistor 410a and the diodes 482, 483, 484 and transistor 410a are thermally decoupled from transistor 405a. As shown, the temperature compensation and bias boost circuit 480 is physically adjacent to the transistor 410a on the die 501, and both are spaced apart from the transistor 405a. Physically separating the diodes 482-484 and transistor 410a from transistor 405a is particularly effective with bipolar transistors implemented in a GaAs process, as the thermal conductivity of GaAs is significantly lower (e.g., about one-third lower) than other semiconductor materials typically used to manufacture CMOS devices, such as silicon. Accordingly, the temperature at one region of a GaAs die may vary considerably from one region of the die to another.

Figure 6:
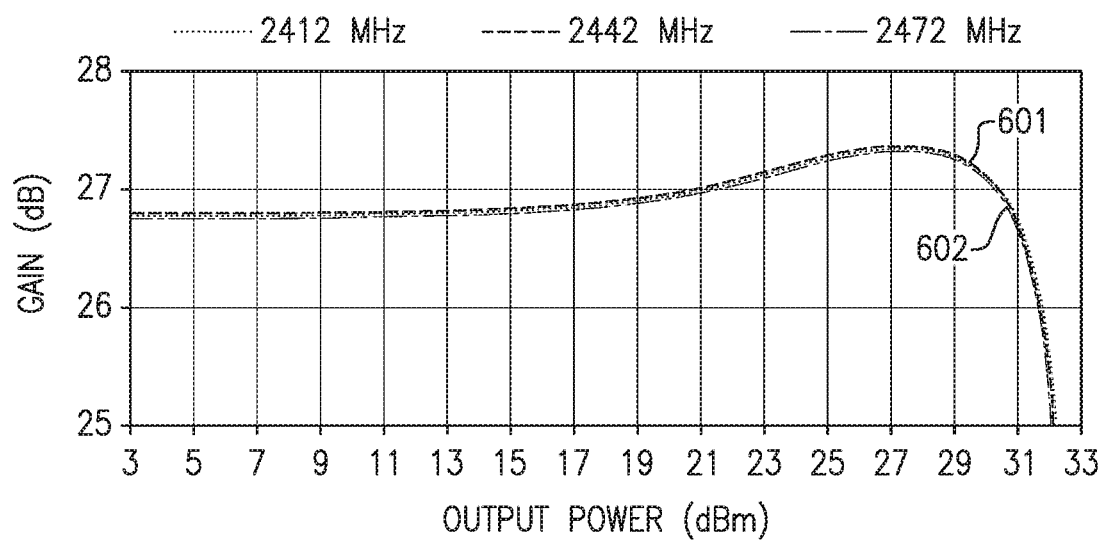
FIG. 6 illustrates the gain of an amplifier versus output power at various frequencies in a power amplifier similar to that of FIG. 4 in accordance with aspects of the present disclosure.
Figure 7:
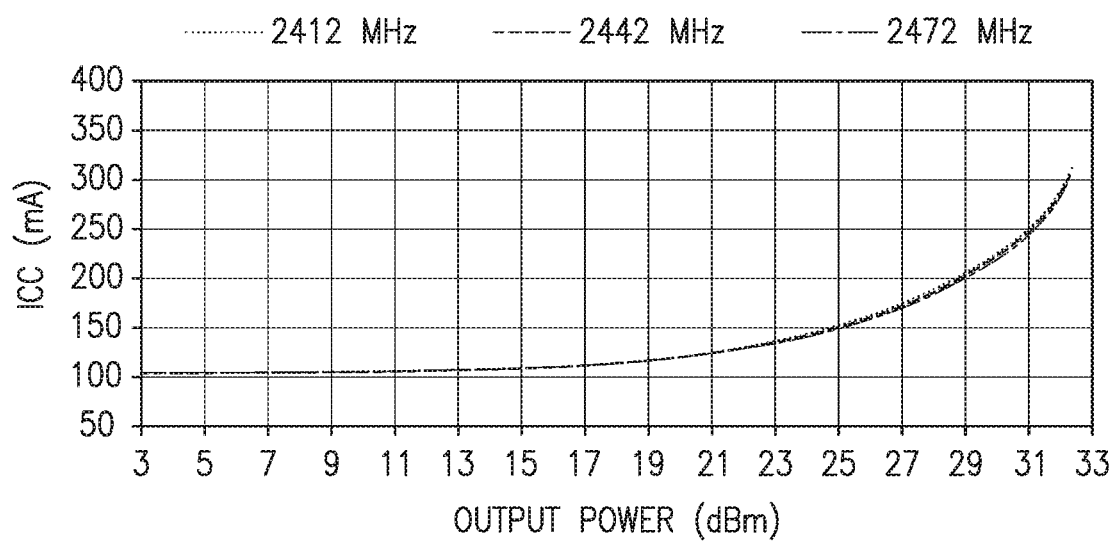
FIG. 7 illustrates the current drawn in the main power transistors of the cascode amplifier of FIG. 4 versus output power at the various frequencies.
Figure 8:
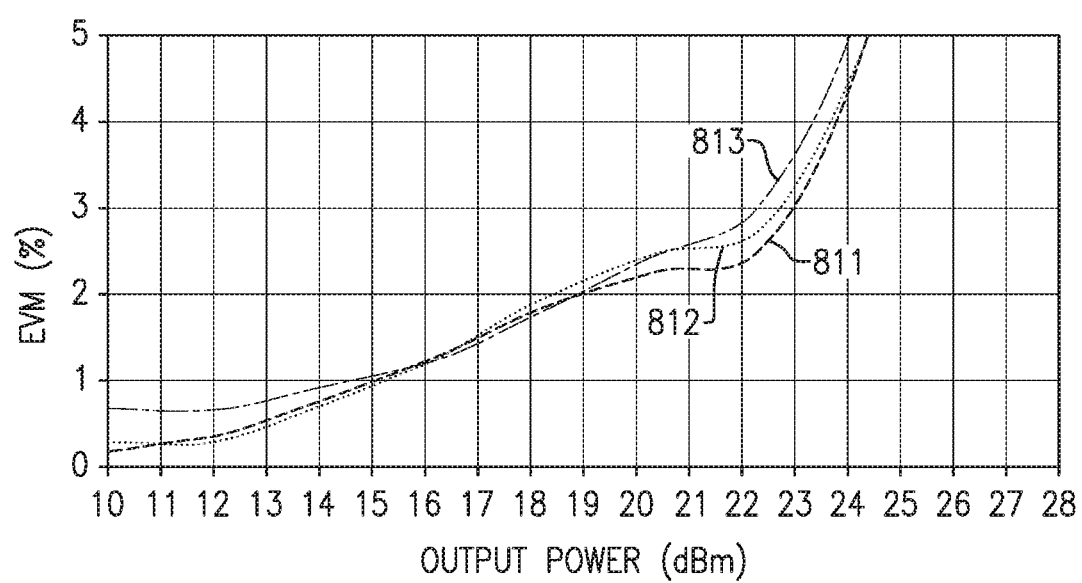
FIG. 8 is a plot of the EVM performance of the power amplifier illustrated in FIG. 4 implemented in GaAs technology in accordance with aspects of the present disclosure.

FIGS. 6-8 illustrate various performance characteristics of a power amplifier implemented in GaAs technology similar in construction to the power amplifier illustrated in FIG. 4 in accordance with aspects of the present disclosure. The power amplifier was connected to a 10 volt supply and designed for a nominal output power of 23 dBm with a goal of achieving less than 3% EVM performance at that power level. The gain of the amplifier versus output power at various frequencies is shown in FIG. 6, with trace 601 corresponding to gain versus output power at 2442 MHz, and trace 602 corresponding to gain versus output power at 2472 MHz. While not visible in FIG. 6, the gain versus output power was also measured at 2412 MHz and is substantially identical to trace 601. As shown in FIG. 6, the 1 dB compression point for this amplifier is about 32 dBm.

The current drawn in the main power transistors 405a and 410a of the cascode output stage 400 versus output power is shown in FIG. 7 at these same frequencies (2412 MHz, 2442 MHz, and 2472 MHz). Note that in FIG. 7, in order to keep the gain constant versus output power, the current through transistors 405a and 410a changes with applied power level as well, due to the bias boosting functionality of the temperature compensation and bias boost circuit 480. In the plot of FIG. 7, the traces of current versus output power at each of the noted frequencies are substantially the same.

FIG. 8 is a plot of the EVM performance of the power amplifier illustrated in FIG. 4 implemented in GaAs technology in accordance with aspects of the present disclosure. Trace 811 represents static EVM where the power amplifier 495 was allowed to reach a stable operating point while transmitting a continuous stream of data. Trace 812 represents Dynamic EVM (DEVM) where the power amplifier was enabled and then used to transmit a short word with an 80 μsec pulse and a 50% duty cycle. Trace 813 represents DEVM where the power amplifier was enabled and then used to transmit a long word with a 4 msec pulse and a 50% duty cycle. As illustrated in FIG. 8, at lower power levels static EVM and DEVM with a short word are almost identical, and at power levels up to about 23 dBm, the short and long word DEVM were only slightly worse than static EVM (e.g., by about 0.2% and 0.5%, respectively), and were less than about 3.5%. Thus, as illustrated in FIGS. 6-8 embodiments of the present disclosure greatly mitigate the impact of temperature induced start-up effects causing DEVM to be worse than static EVM.

Figure 9:
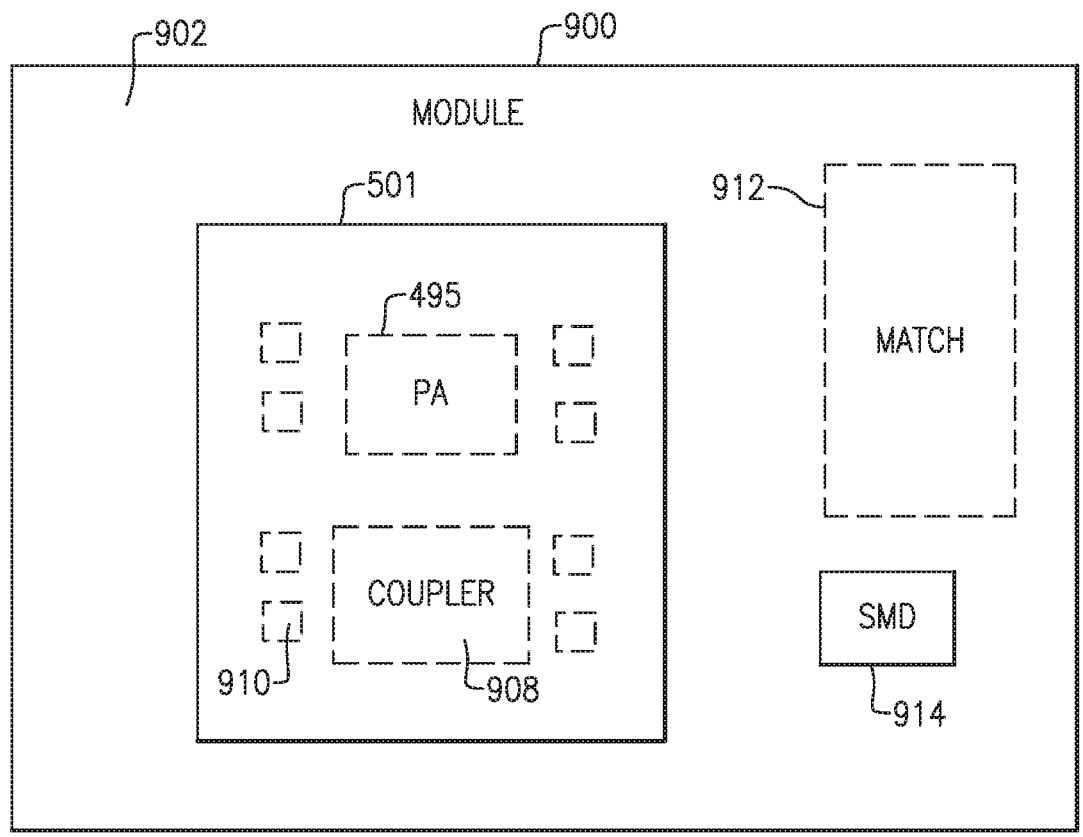
FIG. 9 illustrates an electronic module including an embodiment of a cascode power amplifier circuit.

FIG. 9 illustrates one example of a module 900 that can include any of the embodiments or examples of the cascode power amplifiers 395, 495 disclosed herein. Module 900 has a packaging substrate 902 that is configured to receive a plurality of components, for example, die 501. In some embodiments, the die 501 can include a cascode power amplifier (PA) circuit 395, 495 including one or more embodiments of a cascode power amplifier as disclosed herein and a coupler 908, or other RF components or circuitry known in the art, for example a switch, or filter. A plurality of connection pads 910, for example, solder or gold bumps or posts can facilitate electrical connections to bond pads (not shown) on the substrate 902 to facilitate passing of various power and signals to and from the die 501.

In some embodiments, other components can be mounted on or formed on the packaging substrate 902. For example, one or more surface mount devices (SMD) 914 and one or more matching networks 912 can be implemented. In some embodiments, the packaging substrate 902 can include a laminate substrate.

In some embodiments, the module 900 can also include one or more packaging structures to, for example, provide protection and facilitate easier handling of the module 900. Such a packaging structure can include overmold material formed over the packaging substrate 902 and dimensioned to substantially encapsulate the various circuits and components thereon, for example, die 501.

Embodiments of the module 900 may be advantageously used in a variety of electronic devices. Examples of the electronic devices can include, but are not limited to, consumer electronic products, parts of the consumer electronic products, electronic test equipment, cellular communications infrastructure such as a base station, etc. Examples of the electronic devices can include, but are not limited to, a mobile phone such as a smart phone, a telephone, a television, a computer monitor, a computer, a modem, a hand held computer, a laptop computer, a tablet computer, an electronic book reader, a wearable computer such as a smart watch, a personal digital assistant (PDA), a microwave, a refrigerator, an automobile, a stereo system, a DVD player, a CD player, a digital music player such as an MP3 player, a radio, a camcorder, a camera, a digital camera, a portable memory chip, a health care monitoring device, a vehicular electronics system such as an automotive electronics system or an avionics electronic system, a washer, a dryer, a washer/dryer, a peripheral device, a wrist watch, a clock, etc. Further, the electronic devices can include unfinished products.

Figure 10:
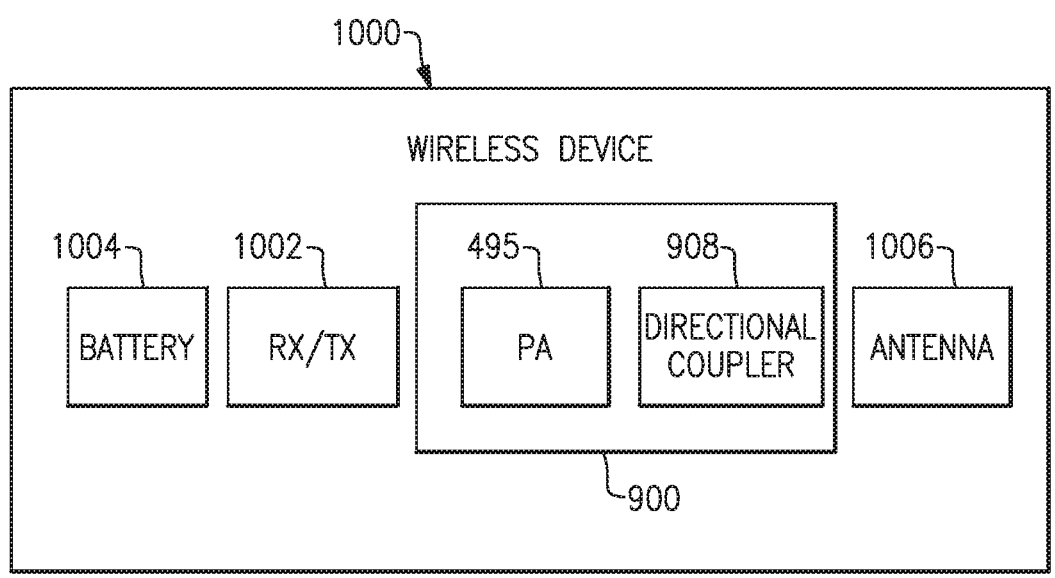
FIG. 10 illustrates a wireless device including an embodiment of a cascode power amplifier circuit.

FIG. 10 is a block diagram of a wireless device 1000 including a flip-chip mounted module 900 according to certain embodiments. The wireless device 1000 can be a cellular phone, smart phone, tablet, modem, communication network or any other portable or non-portable device configured for voice and/or data communication. The wireless device 1000 includes an antenna 1006 that receives and transmits power signals and a coupler 908 that can use a transmitted signal for analysis purposes or to adjust subsequent transmissions. For example, the coupler 908 can measure a transmitted RF power signal from the power amplifier (PA) 495, which amplifies signals from a transceiver 1002. Coupler 908 and PA 495 may be included in a common die 501. The transceiver 1002 can be configured to receive and transmit signals in a known fashion. As will be appreciated by those skilled in the art, the power amplifier 495 can be a power amplifier module including one or more power amplifiers, each of which may include one or more cascode amplifiers as disclosed herein. The wireless device 1000 can further include a battery 1004 to provide operating power to the various electronic components in the wireless device.

Figure 11:
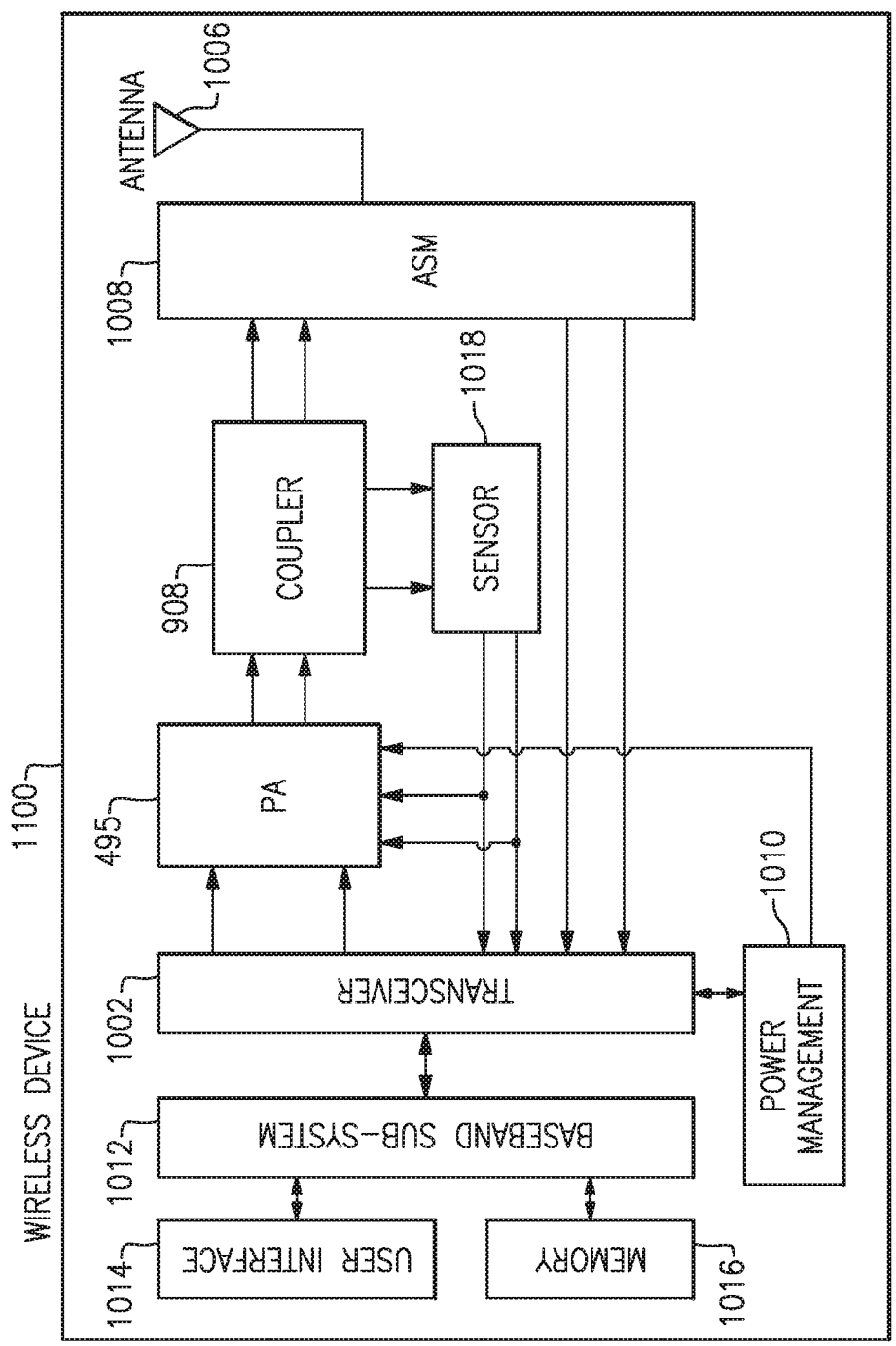
FIG. 11 is a more detailed illustration of the wireless device of FIG. 10.

FIG. 11 is a more detailed block diagram of an example of the wireless device 1100. As shown, the wireless device 1100 can receive and transmit signals from the antenna 1006. The transceiver 1002 is configured to generate signals for transmission and/or to process received signals. Signals generated for transmission are received by the power amplifier (PA) 495, which amplifies the generated signals from the transceiver 1002. In some embodiments, transmission and reception functionalities can be implemented in separate components (e.g. a transmit module and a receiving module), or be implemented in the same module. The antenna switch module 1008 can be configured to switch between different bands and/or modes, transmit and receive modes, etc. As is also shown in FIG. 11, the antenna 1006 both receives signals that are provided to the transceiver 1002 via the antenna switch module 1008 and also transmits signals from the wireless device 1100 via the transceiver 1002, the PA 495, the coupler 908, and the antenna switch module 1008. However, in other examples multiple antennas can be used.

The wireless device 1100 of FIG. 11 further includes a power management system 1010 that is connected to the transceiver 1002 that manages the power for the operation of the wireless device. The power management system 1010 can also control the operation of a baseband sub-system 1012 and other components of the wireless device 1100, such as the power amplifier 495. The power management system 1010 provides power to the wireless device 1100 via the battery 1004 (FIG. 10) in a known manner, and includes one or more processors or controllers that can control the transmission of signals and can also configure the coupler 908 based upon the frequency of the signals being transmitted, for example.

In one embodiment, the baseband sub-system 1012 is connected to a user interface 1014 to facilitate various input and output of voice and/or data provided to and received from the user. The baseband sub-system 1012 can also be connected to memory 1016 that is configured to store data and/or instructions to facilitate the operation of the wireless device, and/or to provide storage of information for the user.

The power amplifier 495 can be used to amplify a wide variety of RF or other frequency-band transmission signals. For example, the power amplifier 495 can receive an enable signal that can be used to pulse the output of the power amplifier to aid in transmitting a wireless local area network (WLAN) signal or any other suitable pulsed signal. The power amplifier 495 can be configured to amplify any of a variety of types of signal, including, for example, a Global System for Mobile (GSM) signal, a code division multiple access (CDMA) signal, a W-CDMA signal, a Long Term Evolution (LTE) signal, or an EDGE signal. In certain embodiments, the power amplifier 1106 and associated components including switches and the like can be fabricated on GaAs substrates using, for example, pHEMT or BiFET transistors, or on a silicon or SOI substrate using CMOS transistors.

Still referring to FIG. 11, the wireless device 1100 can also include a coupler module 908 having one or more directional EM couplers for measuring transmitted power signals from the power amplifier 495 and for providing one or more coupled signals to a sensor module 1018. The sensor module 1018 can in turn send information to the transceiver 1002 and/or directly to the power amplifier 495 as feedback for making adjustments to regulate the power level of the power amplifier 495. In this way the coupler 908 can be used to boost/decrease the power of a transmission signal having a relatively low/high power. It will be appreciated, however, that the coupler 908 can be used in a variety of other implementations.

In certain embodiments in which the wireless device 1100 is a mobile phone having a time division multiple access (TDMA) architecture, the coupler 908 can advantageously manage the amplification of an RF transmitted power signal from the power amplifier 495. In a mobile phone having a time division multiple access (TDMA) architecture, such as those found in Global System for Mobile Communications (GSM), code division multiple access (CDMA), and wideband code division multiple access (W-CDMA) systems, the power amplifier 495 can be used to shift power envelopes up and down within prescribed limits of power versus time. For instance, a particular mobile phone can be assigned a transmission time slot for a particular frequency channel. In this case the power amplifier 495 can be employed to aid in regulating the power level of one or more RF power signals over time, so as to prevent signal interference from transmission during an assigned receive time slot and to reduce power consumption. In such systems, the coupler 908 can be used to measure the power of a power amplifier output signal to aid in controlling the power amplifier 495, as discussed above. The implementation shown in FIG. 11 is exemplary and non-limiting. For example, the implementation of FIG. 11 illustrates the coupler 908 being used in conjunction with a transmission of an RF signal, however, it will be appreciated that coupler 908 can also be used with received RF or other signals as well.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled," as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize.

Having thus described several aspects of at least one embodiment of this invention, it is to be appreciated various alterations, modifications, and improvements will readily occur to those skilled in the art. Any feature described in any embodiment may be included in or substituted for any feature of any other embodiment. Such alterations, modifications, and improvements are intended to be part of this disclosure, and are intended to be within the scope of the invention. Accordingly, the foregoing description and drawings are by way of example only.

What is claimed is:

1. A power amplifier comprising:
   a cascode output stage having an input to receive a radio frequency input signal and an output to provide an amplified radio frequency output signal, the cascode output stage including a first transistor and a second transistor connected in series between a first supply voltage and a reference potential, the first and second transistors each having a base, a collector, and an emitter, the base of the first transistor being coupled to the input to receive the radio frequency input signal, the emitter of the first transistor being coupled to the reference potential, the collector of the first transistor being coupled to the emitter of the second transistor, and the collector of the second transistor being coupled to the first supply voltage and the output to provide the amplified radio frequency output signal;
   a bias circuit coupled to the base of the second transistor to bias the second transistor; and a temperature compensation and bias boost circuit coupled to the base of the first transistor and configured to compensate for changes in temperature of the cascode output stage and to increase a bias current provided to the first transistor in response to an increase in the temperature of the cascode output stage.

2. The power amplifier of claim 1 wherein the temperature compensation and bias boost circuit includes:
a third transistor having a base, a collector, and an emitter, the collector being coupled to a second supply voltage different than the first supply voltage, the emitter being coupled to the base of the first transistor through a first resistor, and the base being coupled to the reference potential through a first capacitor;
a second resistor coupled in series with a first diode between the second supply voltage and the base of the third transistor; and
second and third diodes coupled in series between the base of the third transistor and the reference potential.

3. The power amplifier of claim 2 further comprising at least one additional gain stage coupled to the input of the cascode output stage.

4. The power amplifier of claim 2 wherein the cascode output stage and the temperature compensation and bias boost circuit are integrated on a semiconductor die, and wherein the first, second, and third diodes are physically disposed on the semiconductor die adjacent the first transistor to be closely thermally coupled thereto.

5. The power amplifier of claim 4 wherein the second transistor is physically spaced apart on the semiconductor die from the first transistor to be thermally isolated from the first transistor.

6. The power amplifier of claim 2 wherein changes with temperature of a voltage dropped across the second and third diodes substantially matches changes with temperature of a base to emitter voltage dropped across the first and third transistors.

7. The power amplifier of claim 6 wherein the cascode output stage and the temperature compensation and bias boost circuit are integrated on a GaAs semiconductor die, and wherein the first, second, and third diodes are physically disposed on the GaAs semiconductor die adjacent the first transistor to be closely thermally coupled thereto.

8. The power amplifier of claim 7 wherein the second transistor is physically spaced apart on the GaAs semiconductor die from the first transistor to be thermally isolated from the first transistor.

9. The power amplifier of claim 6 wherein the bias circuit includes:
third and fourth resistors coupled in series between the first supply voltage and the reference potential; and
a fourth transistor having a base, a collector, and an emitter, the base being connected a node connecting the third and fourth resistors, the collector being coupled to the supply voltage, and the emitter being coupled to a second capacitor that is coupled to the reference potential and the base of the second transistor.

10. The power amplifier of claim 9 further comprising an enable circuit coupled to the temperature compensation and bias boost circuit to receive an enable signal and enable the temperature compensation and bias boost circuit and the cascode output stage responsive to the enable signal.

11. The power amplifier of claim 10 further comprising an input impedance matching circuit coupled between the input and the base of the first transistor, the input impedance matching circuit including an inductor coupled between the input and the reference potential and a third capacitor coupled between the input and the base of the first transistor.

12. The power amplifier of claim 10 wherein the enable circuit includes:
a fifth transistor and a sixth transistor each having a base, a collector, and an emitter, the base of the fifth transistor being coupled to the collector of the sixth transistor, the emitter of the fifth transistor and the emitter of the sixth transistor being coupled together and to the reference potential, and the collector of the fifth transistor being coupled to a cathode of the first diode, an anode of the second diode, and the base of the third transistor;
a fifth resistor coupled between the second supply voltage and the collector of the sixth transistor; and
a sixth resistor coupled between the base of the sixth transistor and an enable contact to receive the enable signal.

13. The power amplifier of claim 12 further comprising at least one additional gain stage coupled to the input of the cascode output stage.

14. The power amplifier of claim 13 wherein the cascode output stage and the temperature compensation and bias boost circuit are integrated on a semiconductor die, and wherein the first, second, and third diodes are physically disposed on the semiconductor die adjacent the first transistor to be closely thermally coupled thereto.

15. The power amplifier of claim 14 wherein the second transistor is physically spaced apart on the semiconductor die from the first transistor to be thermally isolated from the first transistor.

16. The power amplifier of claim 15 wherein the semiconductor die is a GaAs semiconductor die.

17. The power amplifier of claim 2 further comprising an enable circuit coupled to the temperature compensation and bias boost circuit to receive an enable signal and enable the temperature compensation and bias boost circuit and the cascode output stage responsive to the enable signal.

18. The power amplifier of claim 17 further comprising an input impedance matching circuit coupled between the input and the base of the first transistor, the input impedance matching circuit including an inductor coupled between the input and the reference potential and a second capacitor coupled between the input and the base of the first transistor.

19. The power amplifier of claim 18 further comprising at least one additional gain stage coupled to the input of the cascode output stage.

* * * * *